United States Patent
Ranta et al.

(10) Patent No.: US 7,018,247 B1
(45) Date of Patent: Mar. 28, 2006

(54) CLAMP-JAW CONTACT ASSEMBLY WITH INTEGRAL JAW SPRING AND METER SOCKET EMPLOYING THE SAME

(75) Inventors: Michael J. Ranta, Bloomington, IL (US); Paul D. Seff, Lincoln, IL (US)

(73) Assignee: Eaton Corporation, Cleveland, OH (US)

(*) Notice: Subject to any disclaimer, the term of this patent is extended or adjusted under 35 U.S.C. 154(b) by 0 days.

(21) Appl. No.: 11/086,947

(22) Filed: Mar. 22, 2005

(51) Int. Cl.
*H01R 13/11* (2006.01)

(52) U.S. Cl. ........................... 439/858; 439/822

(58) Field of Classification Search .......... 439/858, 439/822, 843, 845, 864, 819, 852, 856, 861, 439/833, 839, 517, 745, 747, 733.1, 167, 439/508; 361/662–669
See application file for complete search history.

(56) References Cited

U.S. PATENT DOCUMENTS

| | | | |
|---|---|---|---|
| 3,281,550 A | 10/1966 | Waldrop | |
| 3,662,323 A * | 5/1972 | Stanback | 439/517 |
| 3,880,494 A * | 4/1975 | Reed et al. | 439/517 |
| 4,388,670 A | 6/1983 | Billhartz | |
| 4,532,574 A | 7/1985 | Reiner et al. | |
| 5,775,942 A | 7/1998 | Jeffcoat | |
| 5,980,311 A | 11/1999 | Campbell et al. | |
| 5,997,347 A * | 12/1999 | Robinson et al. | 439/517 |
| 6,275,168 B1 | 8/2001 | Slater et al. | |
| 6,561,844 B1 | 5/2003 | Johnson | |
| 6,565,394 B1 | 5/2003 | Seff et al. | |
| 6,793,542 B1 * | 9/2004 | White | 439/822 |
| 6,921,290 B1 * | 7/2005 | Kellerman | 439/517 |

* cited by examiner

*Primary Examiner*—P. Austin Bradley
*Assistant Examiner*—Edwin A. Leon
(74) *Attorney, Agent, or Firm*—Martin J. Moran

(57) ABSTRACT

A clamp-jaw contact assembly is for a meter socket including a socket block having plurality of meter socket receptacles. The clamp-jaw contact assembly includes a stationary contact structured to engage a corresponding one of the meter socket receptacles, a moveable contact pivotally coupled to the stationary contact by a pivot member, such as a rivet, and a clamping element which is coupled to the stationary contact and includes an integral jaw spring. The integral jaw spring biases the moveable contact toward the stationary contact in order to secure a meter bayonet therebetween. The moveable contact also has a closed position in which it resists insertion of the meter bayonet between the moveable contact and the stationary contact.

11 Claims, 4 Drawing Sheets

CLAMP-JAW CONTACT ASSEMBLY WITH INTEGRAL JAW SPRING AND METER SOCKET EMPLOYING THE SAME

BACKGROUND OF THE INVENTION

1. Field of the Invention

The present invention relates generally to contact assemblies and, more particularly, to a clamp-jaw contact assembly, such as for a watt-hour meter socket. The invention also relates to meter sockets employing clamp-jaw contact assemblies.

2. Background Information

Watt-hour meters are typically used by electric utilities to measure electrical consumption in residential, commercial and industrial applications. To accommodate the watt-hour meter, equipment is provided with a watt-hour meter socket. Such a meter socket contains a plurality of "meter jaws" to accept bayonet stabs or contacts on the base of the watt-hour meter.

Meter sockets having locking jaws for receiving the bayonet or blade contacts of a watt-hour meter are well known. See, for example, U.S. Pat. No. 3,281,550. Meter sockets are generally located in a rectangular enclosure having an opening in a top panel for receiving line cables and an opening in a bottom panel for receiving load cables. The meter socket is mounted to a back panel of the enclosure. A removable front panel has an opening for receiving the dome portion of the meter, which extends therethrough when coupled to the meter socket.

A typical residential meter socket is of the "plug-in type" in which the bayonet stabs on the meter are retained and clamped to corresponding meter jaws using the inherent spring pressure of the meter jaws. For some residential applications, and for the majority of commercial and industrial applications, a "clamp-jaw" type of meter socket is employed. In the clamp-jaw type meter socket, the clamping force of the jaws upon the meter bayonets is enhanced by the addition of a spring, such as a straight beam spring or a coil spring.

In a typical construction, the meter jaw assembly includes a stationary jaw or contact, and a moveable or pivoting jaw or contact. The moveable jaw, with the aid of the aforementioned spring, exerts pressure on the corresponding meter bayonet, thereby clamping it to the stationary jaw. The meter jaw assembly typically further includes a meter bypass which permits changing or testing of the meter without interrupting service to the load end of the meter. See, for example, U.S. Pat. No. 5,775,942. Generally, in the bypass mode of operation, the jaws of the meter jaw assemblies are opened, releasing the meter bayonets, and the line and load contacts of the same phase are shorted by an associated bypass contact member.

FIG. 1 shows a prior clamp-jaw assembly 2, which generally includes three component parts: a stationary contact 4, a moveable contact 6 and a conductor terminal (not shown). The stationary contact 4 is preferably a one-piece construction including an elongated body 8 and a generally unshaped bottom portion 10 having a vertical extension member 12 and a conductor terminal interface 13. The elongated body 8 includes a pair of wings 14, which extend perpendicular to the elongated body 8. Preferably, the stationary contact 4 is stamped and bent into shape from a single piece of conductive metal, such as copper. The moveable contact 6 is pivotally mounted to the stationary contact 4 by a pivot pin 16. The moveable contact 6 is also preferably a one-piece construction. The moveable contact 6 includes a back portion 18 having a pair of wings 20 (only one of the wings 20 is shown) extending substantially perpendicular to the back portion 18. A low portion 22 (shown in hidden line drawing) of the moveable contact 6 is bent for receiving a biasing mechanism, such as a spring 24, to bias a portion 26 of the moveable contact 6 to be in a clamped position with respect to the elongated body 8 of the stationary contact 4.

Another disadvantage of known jaw-type contact assemblies is the fact that they permit the meter bayonet or meter clip to be arbitrarily inserted between the stationary and moveable contacts, even when it would be undesirable or disadvantageous to do so (e.g., without limitation, when the watt-hour meter is not in bypass mode). Specifically, as shown in FIG. 1, the angled design of the upper portion of moveable contact 6 creates a gap 28 between moveable contact 6 and the body 8 of stationary contact 4. Therefore, the meter bayonet (not shown) potentially may be inserted into the gap 28 and the spring bias of the moveable contact 6 can potentially be overcome at any time.

There is, therefore, room for improvement in clamp-jaw contact assemblies.

There is also room for improvement in meter socket assemblies and in meter socket clamp-jaw contact assemblies.

SUMMARY OF THE INVENTION

These needs and others are met by the present invention, which provides a clamping element having an integral jaw spring that may be assembled in a meter socket clamp-jaw contact assembly in order to supply a spring clamping force for securing a meter bayonet. The invention also provides a meter socket clamp-jaw contact assembly structured to resist undesired insertion of the meter bayonet, such as, for example, when the meter is not in a bypass mode.

As one aspect of the invention, a clamp-jaw contact assembly comprises: a stationary contact structured to engage a meter socket receptacle; a moveable contact pivotally coupled to the stationary contact, the moveable contact being structured to resist undesired insertion of a meter bayonet between the moveable contact and the stationary contact; and a clamping element coupled to the stationary contact and including an integral jaw spring, the integral jaw spring being adapted to bias the moveable contact toward the stationary contact.

The moveable contact may include a first position and at least a second position wherein in the first position, the movable contact is biased against the stationary contact in order to resist insertion of the meter bayonet and wherein in the second position, the movable contact is structured to be spaced from the stationary contact in order to receive and secure the meter bayonet between the moveable contact and the stationary contact. The stationary contact may include a substantially flat surface and the moveable contact may include a body portion having a first end with a substantially flat surface wherein when the movable contact is in the first position, the substantially flat surface of the first end of the moveable contact is structured to engage the substantially flat surface of the stationary contact, thereby resisting insertion of the meter bayonet. The stationary contact may include an elongated body and a pair of sides which extend from the elongated body, the moveable contact may include a pivot member, a body portion and a pair of sides which extend from the body portion, and the clamping element may include a generally planar body portion and a pair of sides, the pair of sides and the integral jaw spring extending from the generally planar body portion, wherein the sides of the stationary contact have a first pair of opposing openings, the sides of the moveable contact have a second pair of opposing openings, and the sides of the clamping element have a third pair of opposing openings and the first, second and third pairs of opposing openings are structured to align in order to receive the pivot member therethrough.

The clamping element may be a unitary member wherein the sides of the clamping element comprise a pair of wings extending substantially perpendicular to the generally planar body portion and the integral jaw spring extends from the generally planar body portion beyond the wings in order to provide the bias of the moveable contact toward the stationary contact. The sides of the stationary contact may include a pair of protrusions and the sides of the clamping element may include a pair of receptacles structured to engage the protrusions in order to fix the clamping element with respect to the stationary contact, wherein the integral jaw spring of the clamping element engages the body portion of the moveable contact in order to provide the bias of the moveable contact toward the stationary contact and to maintain the moveable contact in a clamped position with respect to the stationary contact.

As another aspect of the invention, a clamp-jaw contact assembly is for a meter socket including a meter socket receptacle. The clamp-jaw contact assembly comprises: a stationary contact structured to engage the meter socket receptacle; a moveable contact pivotally coupled to the stationary contact by a pivot member, the moveable contact having a closed position and being structured to resist insertion of the meter bayonet between the moveable contact and the stationary contact when the moveable contact is disposed in the closed position; and a clamping element coupled to the stationary contact and including an integral jaw spring, the integral jaw spring biasing the moveable contact toward the stationary contact in order to secure a meter bayonet therebetween.

As another aspect of the invention, a meter socket assembly comprises: a meter socket including a socket block having plurality of meter socket receptacles; and a clamp-jaw contact assembly for each one of the meter socket receptacles, each such clamp-jaw contact assembly comprising: a stationary contact structured to engage a corresponding one of the meter socket cavities, a moveable contact pivotally coupled to the stationary contact by a pivot member, the moveable contact having a closed position and being structured to resist insertion of the meter bayonet between the moveable contact and the stationary contact when the moveable contact is disposed in the closed position, and a clamping element coupled to the stationary contact and including an integral jaw spring, the integral jaw spring biasing the moveable contact toward the stationary contact in order to secure a meter bayonet therebetween.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
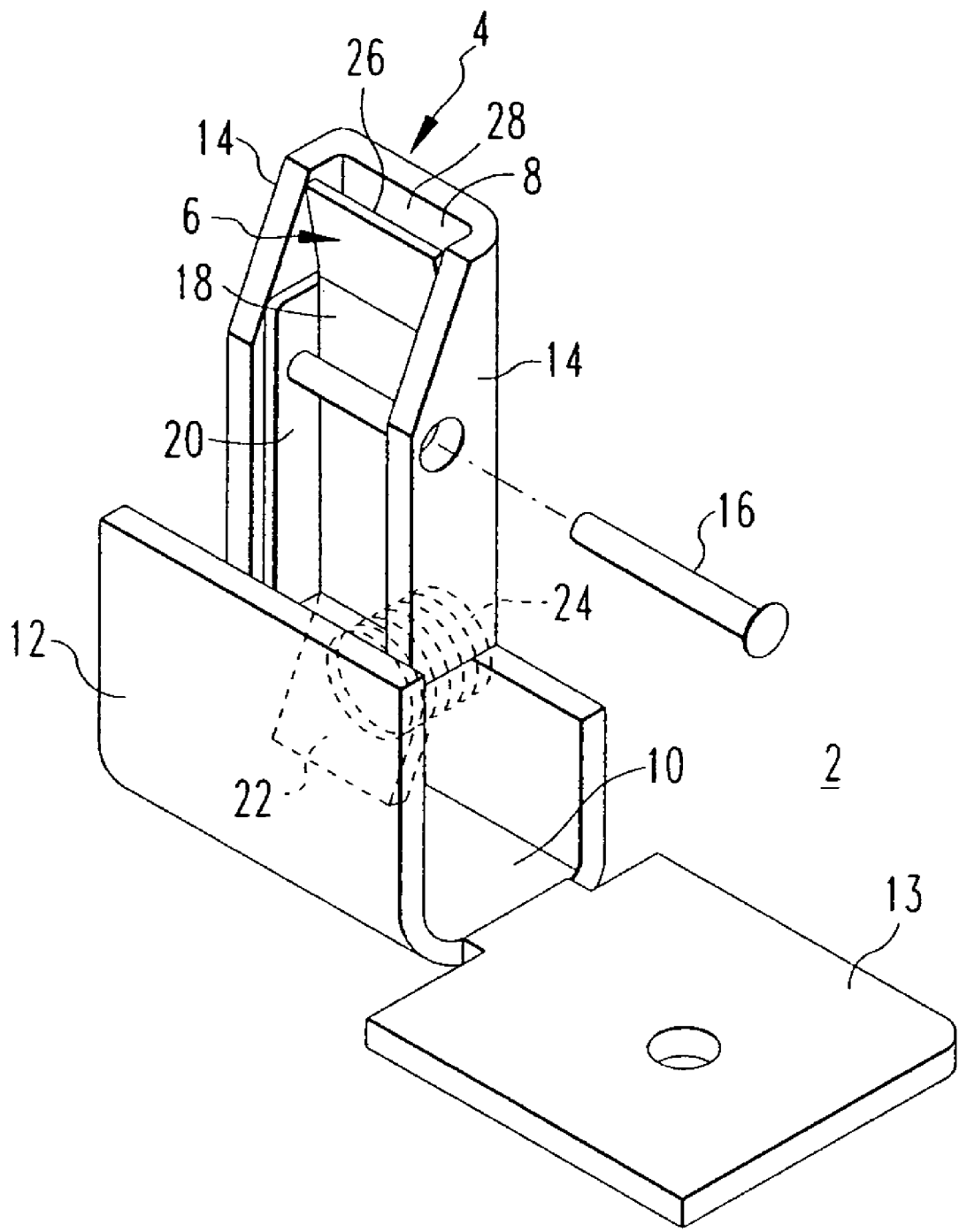
FIG. 1 is an isometric view of a watt-hour meter clamp-jaw assembly.

For purposes of illustration, the invention will be described as applied to a clamp-jaw contact assembly for a watt-hour meter socket assembly, although it will be understood that the invention is applicable to a wide range of clamp-jaw contact assemblies, which provide electrical connection to, for example, without limitation, bayonet stabs, contacts or other types of electrical connections.

Directional phrases used herein, such as, for example, left, right, clockwise, counterclockwise and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

Figure 2:
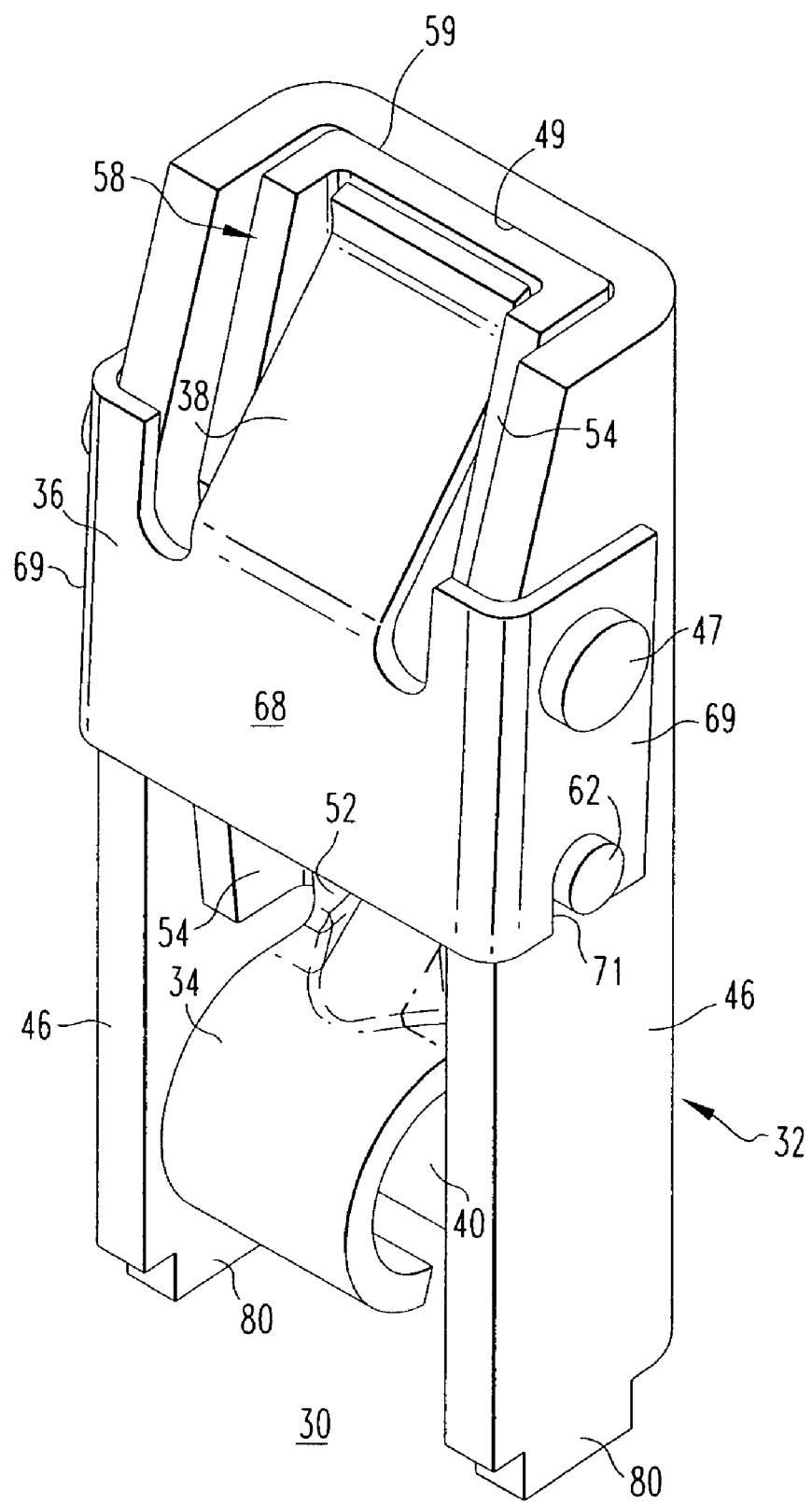
FIG. 2 is an isometric view of a watt-hour meter clamp-jaw assembly with an integral jaw spring in accordance with the invention.
Figure 3:
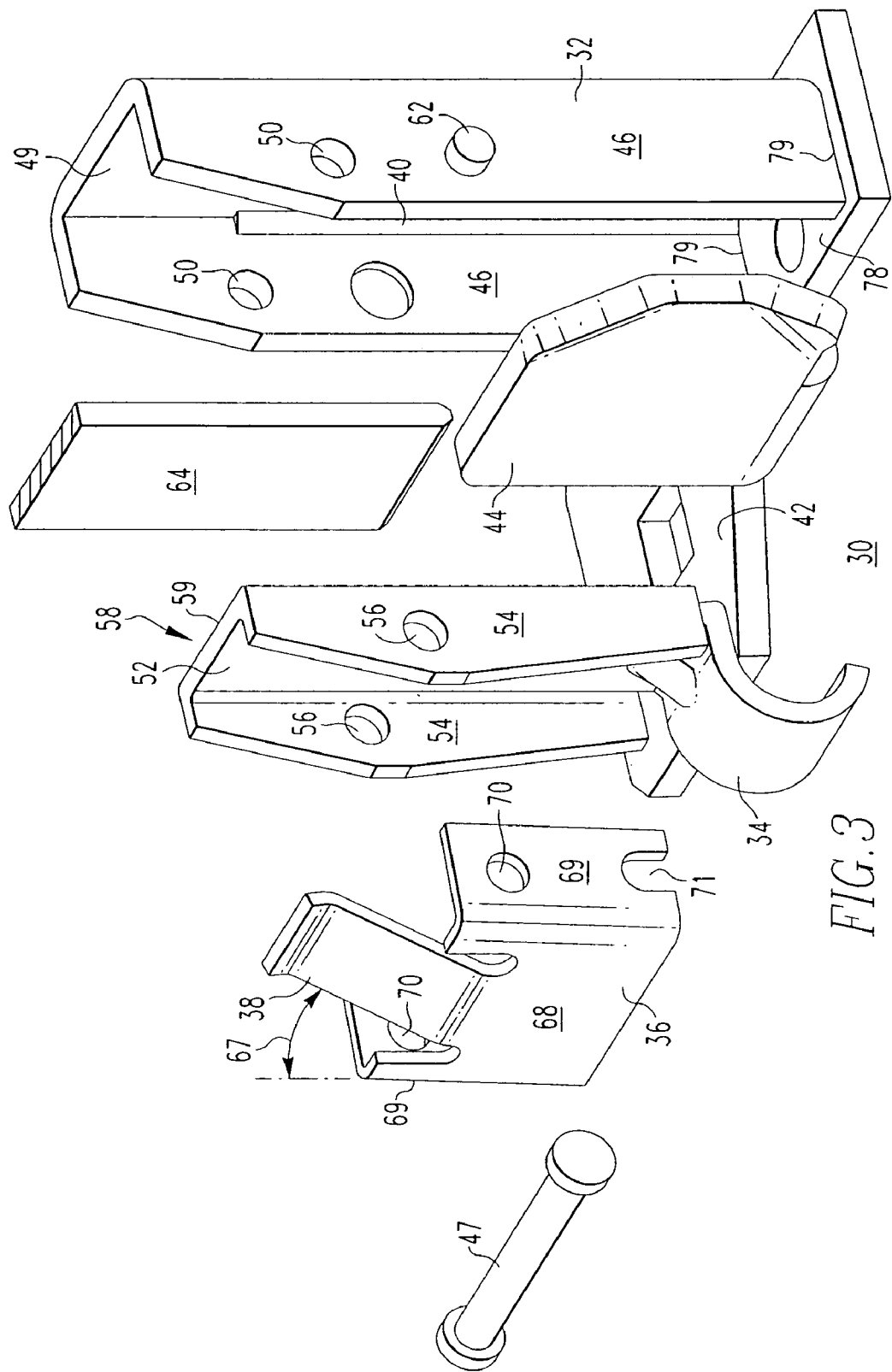
FIG. 3 is an exploded isometric view of the watt-hour meter clamp-jaw assembly of FIG. 2, showing the stationary contact coupled to a conductor terminal.

Referring to FIG. 2, a clamp-jaw contact assembly 30 of the present invention is shown. The clamp-jaw contact assembly 30 is suitable for use with a watt-hour meter socket, such as the meter socket assembly 72 of FIG. 4. An example of such a watt-hour meter socket is disclosed in U.S. Pat. No. 5,775,942, which is incorporated herein by reference. The assembly 30 includes a stationary contact 32, a moveable contact 34 (as best shown in FIG. 3) and a clamping element 36 (as best shown in FIG. 3). The stationary contact 32 is preferably a one-piece construction including an elongated body 40. Unlike the stationary contact 4 of FIG. 1, stationary contact 32 does not require a generally unshaped bottom portion 42 having a vertical extension member 44. These elements may instead be part of the terminal conductor 78 (FIG. 3) into which the stationary contact 32 is inserted (best shown in FIG. 4). The stationary contact 32 includes a pair of sides or wings 46, which extend substantially perpendicular to the elongated body 40 thereof. Preferably, each of the stationary contact 32 (e.g., made of copper), the moveable contact 34 (e.g., made of copper or heat treated steel), and the clamping element 36 (e.g., made of steel) are stamped and bent or folded into shape from a single piece of conductive metal. However, it will be appreciated that any known or suitable material and manufacturing process could be employed.

The moveable contact 34 is pivotally coupled to the stationary contact 32 by a pivot member 47 which, in the example shown and described herein, is a rivet. The moveable contact 34 is also preferably a one-piece construction and includes a body portion 52 with a first end 58 and a pair of sides or wings 54 extending substantially perpendicular to the back portion 52 (best shown in FIG. 3). The clamping element 36, which is preferably a unitary member, includes an integral jaw spring 38 which is structured to extend from a generally planar body portion 68 in order to bias the moveable contact 34 toward the stationary contact 32.

More specifically, as best shown in FIG. 3, the stationary contact 32 includes a first pair of opposing openings 50 extending through wings 46, the wings 54 of the moveable contact 34 have a second pair of opposing openings 56, and the clamping element 36 includes a pair of sides 69 having a third pair of opposing openings 70. The first, second and third pairs of opposing openings 50,56,70 are structured to align in order to receive the rivet 47 therethrough (best shown in FIG. 2). Accordingly, the moveable contact 34 is positioned between the wings 46 of the stationary contact 32 and the clamping element 68 is attached to the stationary contact 32 such that the sides 69 of the clamping element 68 are disposed on the outside surfaces of the wings 46 of the stationary contact 32 (FIG. 2). The sides 69 of the clamping element 36 comprise a pair of wings extending substantially perpendicular to the generally planar body portions 68. The integral jaw spring 38 extends from the generally planar body portion 68 beyond the sides 69 in order to provide the aforementioned bias of the moveable contact 34 toward the stationary contact 32. In the example of FIG. 3, the integral jaw spring 38 extends from the generally planar body portion 68 at an angle 67 of between about 40 degrees and about 50 degrees with respect thereto. However, it will be appreciated that the integral jaw spring 38 could extend at any suitable alternative angle with respect to the generally planar body portions 68 of the clamping element 36.

Figure 4:
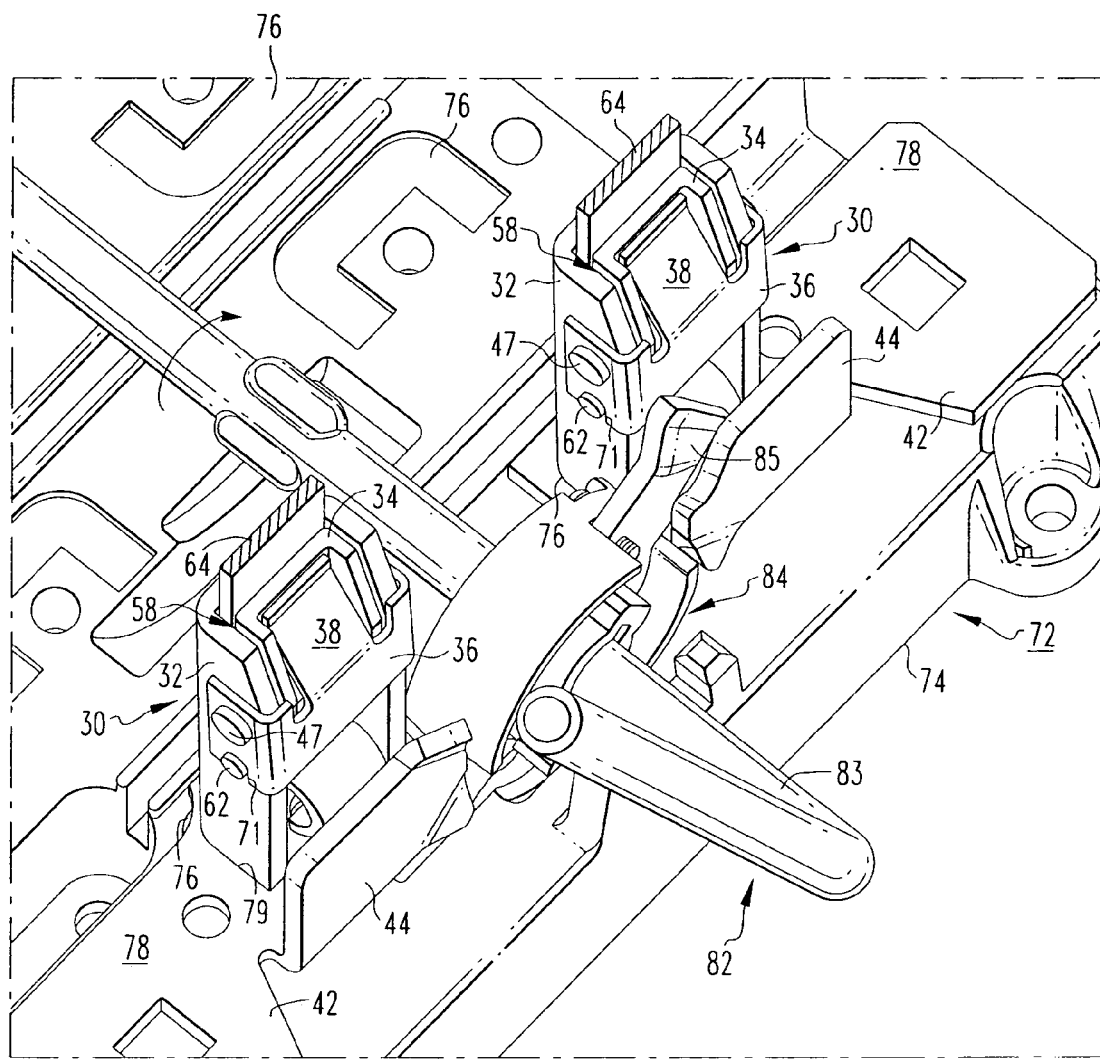
FIG. 4 is an isometric view of a portion of a meter socket assembly with two clamp-jaw contact assemblies, including the clamp-jaw assembly of FIG. 2, and a meter bypass in accordance with an embodiment of the invention

In order to secure the clamping element 36 with respect to the stationary contact 32 such that it may provide the aforementioned bias of the moveable contact 34, the sides 69 of the clamping element 36 include a pair of receptacles 71 which each engage a corresponding one of a pair of protrusions 62 on the wings 46 of stationary contact 32. In this manner, the exemplary clamping element 36 remains fixed with respect to the stationary contact 32 as the integral jaw spring 38 of the clamping element 36 engages the body portion 52 of the moveable contact 34 to bias it toward the stationary contact 32 and maintain the moveable contact 34 in a clamped position with respect to the same. Accordingly, the moveable contact 34 of the clamp-jaw contact assembly 30 includes a first position, shown in FIG. 2, in which the moveable contact 34 is biased by the integral jaw spring 38 against the stationary contact 32 in order to resist insertion of a meter bayonet 64 (FIGS. 3 and 4), and at least a second position in which, as shown in FIG. 4, the moveable contact 34 is spaced from the stationary contact 32 to receive and secure the meter bayonet 64 therebetween. More specifically, unlike the interface between the stationary contact 4 and moveable contact 6 of FIG. 1, which creates a gap 28 therebetween, no gap is present between the stationary contact 32 and moveable contact 34 when the exemplary moveable contact 34 is in the first, or closed position shown in FIG. 2. More particularly, the stationary contact 32 includes a substantially flat surface 49 and the moveable contact 34 includes a body portion 52 having a first end 58 with a corresponding substantially flat surface 59. When the moveable contact 34 is in the first, or closed position, the substantially flat surface 59 of the first end 58 of the moveable contact 34 engages the substantially flat surface 49 of stationary contact 32, thereby resisting insertion of meter bayonet 64 (FIG. 4). In this manner, the clamp-jaw contact assembly 30 of the present invention provides a closed position structured to resist undesired insertion of the meter bayonet 64, such as, for example, when the meter (not shown) is not in a bypass mode.

FIG. 4 shows a portion of a meter socket assembly 72 formed in accordance with the present invention. An insulative base or socket block 74 of the meter socket assembly 72 includes a series of meter socket receptacles 76 recessed into the block 74 for receiving each of the contact assemblies 30 and the conductor terminals 78 connected thereto. The contact assemblies 30 and terminals 78 may be coupled to the socket block 74 using any known or suitable fastener or securing mechanism (not shown).

Two clamp-jaw contact assemblies 30 and a meter bypass 82 are shown in FIG. 4. The meter bypass 82 includes, for example, a pivotal shaft 83 having a cam assembly 84 with an actuator arm 85 extending therefrom. The actuator arm is structured to engage the arcuate bottom (from the perspective of FIG. 4) portion of the moveable contact 32 when the shaft 83 of the meter bypass 82 is rotated as indicated generally by the arrow 86 of FIG. 4, in order to initiate the bypass mode. In response, the moveable contact 34 pivots about rivet 47 overcoming the bias provided by the integral jaw spring 38 of clamping element 36, in order to separate the first end 58 of moveable contact 34 from the stationary contact 32 and to permit insertion of the meter bayonet 64, as shown. When the shaft 83 is returned to the position shown in FIG. 4, the actuator arm 85 disengages and releases the moveable contact 34. As a result, the integral jaw spring 38 of clamping element 36 provides the bias of the moveable contact 34 towards the stationary contact 32 thereby clamping the meter clip or bayonet 64, which is sandwiched between the substantially flat surface 49 (FIG. 3) of the stationary contact 32 and the corresponding substantially flat surface 59 (FIG. 3) of the moveable contact 34.

Accordingly, the clamp-jaw contact assembly 30 and the integral jaw spring 38 thereof of the present invention provide a suitable spring force in order to securely clamp the meter clip 64 to the surface 49 of the stationary contact 32 by the surface 59 of the moveable contact 34, while providing a mechanism to resist undesired insertion of the meter bayonet 64.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A clamp-jaw contact assembly comprising;
    a stationary contact structured to engage a meter socket receptacle;
    a moveable contact pivotally coupled to said stationary contact, said moveable contact being structured to resist undesired insertion of a meter bayonet between said moveable contact and said stationary contact;
    a clamping element coupled to said stationary contact and including an integral jaw spring, said integral jaw spring being adapted to bias said moveable contact toward said stationary contact; and
    wherein said stationary contact includes an elongated body and a pair of sides which extend from said elongated body, wherein said moveable contact includes a pivot member, a body portion and a pair of sides which extend from said body portion; wherein said clamping element includes a generally planar body portion and a pair of sides, said pair of sides and said integral jaw spring extending from said generally planar body portion; wherein the sides of said stationary contact have a first pair of opposing openings, the sides of said moveable contact have a second pair of opposing openings, and the sides of said clamping element have a third pair of opposing openings; and wherein said first, second and third pairs of opposing openings are structured to align in order to receive said pivot member therethrough.

2. The clamp-jaw contact assembly of claim 1 wherein said clamping element is a unitary member; wherein the sides of said clamping element comprise a pair of wings extending substantially perpendicular to said generally planar body portion; and wherein said integral jaw spring extends from said generally planar body portion beyond said wings in order to provide said bias of said moveable contact toward said stationary contact.

3. The clamp-jaw contact assembly of claim 1 wherein said integral jaw spring extends from said generally planar body portion at an angle of between about 40 degrees and about 50 degrees with respect thereto.

4. The clamp-jaw contact assembly of claim 1 wherein said pivot member is a rivet.

5. The clamp-jaw contact assembly of claim 1 wherein the sides of said stationary contact include a pair of protrusions; wherein the sides of said clamping element include a pair of receptacles structured to engage said protrusions in order to fix said clamping element with respect to said stationary contact; and wherein said integral jaw spring of said clamping element engages said body portion of said moveable contact in order to provide said bias of said moveable contact toward said stationary contact and to maintain said moveable contact in a clamped position with respect to said stationary contact.

6. A clamp-jaw contact assembly for a meter socket including a meter socket receptacle, said clamp-jaw contact assembly comprising:
 a stationary contact structured to engage said meter socket receptacle;
 a moveable contact pivotally coupled to said stationary contact by a pivot member, said moveable contact having a closed position and being structured to resist insertion of said meter bayonet between said moveable contact and said stationary contact when said moveable contact is disposed in said closed position;
 a clamping element coupled to said stationary contact and including an integral jaw spring, said integral jaw spring biasing said moveable contact toward said stationary contact in order to secure a meter bayonet therebetween; and
wherein said stationary contact includes an elongated body and a pair of sides which extend from said elongated body; wherein said moveable contact includes a body portion and a pair of sides which extend from said body portion; wherein said clamping element includes a generally planar body portion and a pair of sides, said pair of sides and said integral jaw spring extending from said generally planar body portion; wherein the sides of said stationary contact have a first pair of opposing openings, the sides of said moveable contact have a second pair of opposing openings, and the sides of said clamping element have a third pair of opposing openings; and
wherein said first, second and third pairs of opposing openings are aligned and receive said pivot member therethrough.

7. The clamp-jaw contact assembly of claim 6 wherein said clamping element is a unitary member; wherein the sides of said clamping element comprise a pair of wings extending substantially perpendicular to said generally planar body portion; and wherein said integral jaw spring extends from said generally planar body portion beyond said wings to provide said bias of said moveable contact toward said stationary contact.

8. The clamp-jaw contact assembly of claim 6 wherein the sides of said stationary contact include a pair of protrusions proximate said first pair of opposing openings; wherein the sides of said clamping element include a pair of receptacles structured to engage said protrusions in order to fix said clamping element with respect to said stationary contact; and wherein said integral jaw spring of said clamping element engages said body portion of said moveable contact in order to provide said bias of said moveable contact toward said stationary contact and to maintain said moveable contact in a clamped position with respect to said stationary contact.

9. A meter socket assembly comprising:
 a meter socket including a socket block having plurality of meter socket receptacles; and
 a clamp-jaw contact assembly for each one of said meter socket receptacles, each said clamp-jaw contact assembly comprising:
 a stationary contact structured to engage a corresponding one of said meter socket receptacles,
 a moveable contact pivotally coupled to said stationary contact by a pivot member, said moveable contact having a closed position and being structured to resist insertion of said meter bayonet between said moveable contact and said stationary contact when said moveable contact is disposed in said closed position,
 a clamping element coupled to said stationary contact and including an integral jaw spring, said integral jaw spring biasing said moveable contact toward said stationary contact in order to secure a meter bayonet therebetween, and
 wherein said stationary contact includes an elongated body and a pair of sides which extend from said elongated body; wherein said moveable contact includes a body portion and a pair of sides which extend from said body portion; wherein said clamping element includes a generally planar body portion and a pair of sides, said pair of sides and said integral jaw spring extending from said generally planar body portion; wherein the sides of said stationary contact have a first pair of opposing openings, the sides of said moveable contact have a second pair of opposing openings, and the sides of said clamping element have a third pair of opposing openings; and wherein said first, second and third pairs of opposing openings are attached and aligned and receive said pivot member therethrough.

10. The meter socket assembly of claim 9 wherein said clamping element is a unitary member; wherein the sides of said clamping element comprise a pair of wings extending substantially perpendicular to said generally planar body portion; and wherein said integral jaw spring extends from said generally planar body portion beyond said wings in order to provide said bias of said moveable contact toward said stationary contact.

11. The meter socket assembly of claim 9 wherein the sides of said stationary contact include a pair of protrusions proximate said first pair of opposing openings; wherein the sides of said clamping element include a pair of receptacles structured to engage said protrusions in order to fix said clamping element with respect to said stationary contact; and wherein said integral jaw spring of said clamping element engages said body portion of said moveable contact in order to provide said bias of said moveable contact toward said stationary contact and to maintain said moveable contact in a clamped position with respect to said stationary contact.

* * * * *